(12) United States Patent
Agarwal et al.

(10) Patent No.: US 9,997,371 B1
(45) Date of Patent: Jun. 12, 2018

(54) ATOMIC LAYER ETCH METHODS AND HARDWARE FOR PATTERNING APPLICATIONS

(71) Applicant: Lam Research Corporation, Fremont, CA (US)

(72) Inventors: Pulkit Agarwal, Beaverton, OR (US); Purushottam Kumar, Hillsboro, OR (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 0 days. days.

(21) Appl. No.: 15/582,359

(22) Filed: Apr. 28, 2017

Related U.S. Application Data

(60) Provisional application No. 62/489,113, filed on Apr. 24, 2017.

(51) Int. Cl.
| | |
|---|---|
| *H01L 21/027* | (2006.01) |
| *H01L 21/28* | (2006.01) |
| *H01L 21/3105* | (2006.01) |
| *H01L 21/311* | (2006.01) |
| *G03F 7/42* | (2006.01) |

(52) U.S. Cl.
CPC ........ *H01L 21/31056* (2013.01); *G03F 7/427* (2013.01); *H01L 21/0273* (2013.01); *H01L 21/31058* (2013.01); *H01L 21/31138* (2013.01)

(58) Field of Classification Search
CPC ... H01L 21/027; H01L 21/0335; H01L 21/28; H01L 21/033
See application file for complete search history.

(56) References Cited

U.S. PATENT DOCUMENTS

| | | | |
|---|---|---|---|
| 4,592,801 | A | 6/1986 | Hara et al. |
| 5,501,893 | A | 3/1996 | Laermer et al. |
| 6,177,353 | B1 | 1/2001 | Gutsche et al. |
| 6,448,192 | B1 | 9/2002 | Kaushik |

(Continued)

FOREIGN PATENT DOCUMENTS

| | | |
|---|---|---|
| WO | WO 2011/081921 A2 | 7/2011 |
| WO | WO 2016/100873 A1 | 6/2016 |

OTHER PUBLICATIONS

U.S. Office Action dated Jun. 17, 2016 issued in U.S. Appl. No. 14/696,254.

(Continued)

*Primary Examiner* — Mohammad Choudhry
(74) *Attorney, Agent, or Firm* — Weaver Austin Villeneuve & Sampson LLP

(57) ABSTRACT

Methods and apparatuses for patterning carbon-containing material over a layer to be etched are provided herein. Methods involve trimming carbon-containing material by atomic layer etching including exposing the carbon-containing material to an oxygen-containing gas without a plasma to modify a surface of the carbon-containing material and exposing the carbon-containing material to an inert gas and igniting a plasma to remove the modified surface of the carbon-containing material. Methods may be used for multiple patterning techniques such as double and quad patterning. Methods also include depositing a conformal film over a carbon-containing material patterned using atomic layer etching without breaking vacuum.

16 Claims, 10 Drawing Sheets

(56) References Cited

U.S. PATENT DOCUMENTS

| | | | |
|---|---|---|---|
| 6,482,745 | B1 | 11/2002 | Hwang |
| 7,196,955 | B2 | 3/2007 | Nickel |
| 7,416,989 | B1 | 8/2008 | Liu et al. |
| 7,795,148 | B2 | 9/2010 | Brown |
| 8,252,194 | B2 | 8/2012 | Kiehlbauch et al. |
| 8,808,561 | B2 | 8/2014 | Kanarik |
| 8,883,028 | B2 | 11/2014 | Kanarik |
| 8,993,352 | B2 | 3/2015 | Nishimura et al. |
| 9,130,158 | B1 | 9/2015 | Shen et al. |
| 9,257,638 | B2 | 2/2016 | Tan et al. |
| 9,449,843 | B1 | 9/2016 | Korolik et al. |
| 9,576,811 | B2 | 2/2017 | Kanarik et al. |
| 9,805,941 | B2 | 10/2017 | Kanarik et al. |
| 9,806,252 | B2 | 10/2017 | Tan et al. |
| 2001/0053585 | A1 | 12/2001 | Kikuchi et al. |
| 2002/0081381 | A1 | 6/2002 | DeLaRosa et al. |
| 2004/0004056 | A1 | 1/2004 | Sasaki et al. |
| 2004/0137749 | A1 | 7/2004 | Ying et al. |
| 2004/0209476 | A1 | 10/2004 | Ying et al. |
| 2006/0009040 | A1 | 1/2006 | Tomioka et al. |
| 2006/0194435 | A1 | 8/2006 | Nishimura et al. |
| 2007/0049036 | A1 | 3/2007 | Huang |
| 2007/0238301 | A1 | 10/2007 | Cabral et al. |
| 2007/0246442 | A1 | 10/2007 | America et al. |
| 2009/0020884 | A1 | 1/2009 | Lee et al. |
| 2009/0256220 | A1 | 10/2009 | Horng et al. |
| 2011/0139748 | A1 | 6/2011 | Donnelly et al. |
| 2012/0276657 | A1 | 11/2012 | Joubert et al. |
| 2013/0168354 | A1 | 7/2013 | Kanarik |
| 2015/0037972 | A1 | 2/2015 | Danek et al. |
| 2015/0214474 | A1 | 7/2015 | Nishimura et al. |
| 2015/0270140 | A1 | 9/2015 | Gupta et al. |
| 2016/0203995 | A1 | 7/2016 | Kanarik et al. |
| 2016/0308112 | A1 | 10/2016 | Tan et al. |
| 2016/0314985 | A1 | 10/2016 | Yang et al. |
| 2017/0040214 | A1 | 2/2017 | Lai et al. |
| 2017/0117159 | A1 | 4/2017 | Kanarik et al. |
| 2017/0125256 | A1* | 5/2017 | Lee ................... H01L 21/3081 |
| 2017/0229311 | A1 | 8/2017 | Tan et al. |
| 2017/0229314 | A1 | 8/2017 | Tan et al. |
| 2017/0316935 | A1 | 11/2017 | Tan et al. |

OTHER PUBLICATIONS

U.S. Notice of Allowance dated Oct. 14, 2016 issued in U.S. Appl. No. 14/696,254.

U.S. Notice of Allowance dated Jun. 29, 2017 issued in U.S. Appl. No. 15/400,368.

U.S. Office Action dated May 5, 2016 issued in U.S. Appl. No. 14/749,285.

U.S. Final Office Action dated Sep. 23, 2016 issued in U.S. Appl. No. 14/749,285.

U.S. Office Action dated Feb. 17, 2017 issued in U.S. Appl. No. 14/749,285.

U.S. Final Office Action dated Mar. 30, 2017 issued in U.S. Appl. No. 14/749,285.

U.S. Office Action dated Aug. 11, 2017 issued in U.S. Appl. No. 14/749,285.

U.S. Notice of Allowance dated Sep. 29, 2017 issued in U.S. Appl. No. 14/749,285.

U.S. Office Action dated Nov. 28, 2016 issued in U.S. Appl. No. 14/749,291.

U.S. Notice of Allowance dated Jun. 30, 2017 issued in U.S. Appl. No. 14/749,291.

Boullart et al. (Mar. 29, 2013) "STT MRAM patterning challenges," *Proc. SPIE, Advanced Etch Technology for Nanopatterning II, Proc. of SPIE* 8685:86850F-1-86850F-9 [Retrieved on Jun. 2, 2015 from http://proceedings.spiedigitallibrary.org].

Ditizio, Robert and Werbaneth, Paul, Tegal Corporation and Zhu, Jian-Gang, Carnegie Mellon University (Jan. 2004) "Cell Shape and Patterning Considerations for Magnetic Random Access Memory (MRAM) Fabrication," Reprinted with permission from *Semiconductor Manufacturing Magazine*, 7 pp.

Faraz et al., (2015) "Atomic Layer Etching: What Can We Learn from Atomic Layer Deposition?," *ECS Journal of Solid State Science and Technology*, 4(6):N5023-N5032.

Jiang et al. (1998) "Complexes Containing Unbridged Dative Metal-Metal Bonds and the Strong Acceptor $Ru(CO)_3(SiCl_3)_2$ Moiety. Comments on the Transition Metal to Silicon Bond," *Organometallics*, 17(26):5810-5819.

Kanarik et al. (Mar./Apr. 2015) "Overview of atomic layer etching in the semiconductor industry," *J. Vac. Sci. Technol. A*, 33(2):020802-1-020802-14.

Lee et al. (2015) "Atomic Layer Etching of $Al_2O_3$ Using Sequential, Self-Limiting Thermal Reactions with $Sn(acac)_2$ and Hydrogen Fluoride," $^{ACS}NANO$,9(2):2061-2070.

Pomeroy, R.K. And Wijesekera, K.S. (1980) "Preparation and derivatives of cis-$M(CO)_4(SiCl_3)_2$ (M=FE, RU, OS)," *Inorg. Chem.*, 19(12):3729-3735.

Puurunen, Rikka L. (2005) "Surface chemistry of atomic layer deposition: A case study for the trimethylaluminum/water process," *Journal of Applied Physics*, 97:121301-51 pages.

Gottscho, Richard (Jul. 16, 2017) "Atomic Layer Etching—An Overview of Possibilities and Limitations," *Plenary Talk presented at American Vacuum Society 17th International Conference on Atomic Layer Deposition (ALD 2017) and 4th International Atomic Layer Etching Workshop (ALE 2017)*, Lam Research Corp., 21pp.

Schmitt et al. (2006) "Synthesis and Properties of Single-Crystal FeSi Nanowires," *Nano Lett.*, 6(8):1617-1621.

Schmitt et al. (Feb. 1, 2008) "Chemical Synthesis and Magnetotransport of Magnetic Semiconducting $Fe_{1-x}Co_xSi$ Alloy Nanowires," *Nano Lett.*, 8(3):810-815.

Wolf, S. And Tauber, R.N. (1986) "Silicon Processing for the VLSI Era," vol. *1-Process Technology, Lattice Press*, pp. 542-557.

U.S. Office Action dated Nov. 29, 2017 issued in U.S. Appl. No. 15/421,189.

Kanarik et al., (Sep./Oct. 2017) "Predicting synergy in atomic layer etching," *J. Vac. Sci. Technol. A*, 35(5):05C302-1 through 05C302-7.

U.S. Appl. No. 15/581,951, filed Apr. 28, 2017, Reddy et al.
U.S. Appl. No. 15/719,484, filed Sep. 28, 2017, Kanarik et al.
U.S. Appl. No. 15/719,497, filed Sep. 28, 2017, Tan et al.
U.S. Appl. No. 15/494,245, filed Apr. 21, 2017, Tan et al.
U.S. Appl. No. 15/654,612, filed Jul. 19, 2017, Agarwal et al.

\* cited by examiner

ATOMIC LAYER ETCH METHODS AND HARDWARE FOR PATTERNING APPLICATIONS

CROSS-REFERENCE TO RELATED APPLICATION

This application claims benefit of U.S. Provisional Patent Application No. 62/489,113, filed Apr. 24, 2017, and titled "ATOMIC LAYER ETCH METHODS AND HARDWARE FOR PATTERNING APPLICATIONS," which is incorporated by reference herein in its entirety and for all purposes.

BACKGROUND

Fabrication of advanced integrated circuits often involves patterning of small features in high volume manufacturing of semiconductors. Multiple patterning techniques may enable feature size scaling based on lithographic techniques such as 193 nm immersion lithography. Self-aligned double patterning is an example of a multiple patterning technique. Multiple patterning involves etching of materials which is typically performed by conventional isotropic etching techniques.

SUMMARY

Provided herein are methods of processing semiconductor substrates. One aspect involves a method of processing a semiconductor substrate, the method including: (a) providing to a chamber the semiconductor substrate including a carbon containing material having a pattern of carbon-containing features; and (b) trimming the carbon-containing features by atomic layer etching to reduce the critical dimension and form trimmed carbon-containing features having vertical sidewalls, the atomic layer etching including: (i) exposing the surface of the carbon-containing features to an oxygen-containing gas without a plasma to modify the surface of the carbon-containing material; and (ii) exposing the modified surface of the carbon-containing features to an inert gas and igniting a plasma to move the modified surface of the carbon-containing features.

In various embodiments, the oxygen-containing gas is any one or more of oxygen and nitrous oxide. The inert gas may be any of helium, nitrogen, argon, and combinations thereof.

In various embodiments, the carbon-containing features include any one of spin-on carbon, photoresist, and amorphous carbon.

The chamber may be set to a chamber pressure between about 1 Torr and about 10 Torr. In some embodiments, the plasma is ignited using a plasma power between about 50 W and 250 W.

The method may also include purging the chamber between exposing the surface of the carbon-containing features to the oxygen-containing gas without a plasma and exposing the surface of the carbon-containing features to the inert gas and igniting the plasma. The chamber may be purged for a duration between about 0.1 seconds and about 0.5 seconds.

In some embodiments, the atomic layer etching also includes repeating (i) and (ii) in cycles. For example, in some embodiments, between about 5 cycles and about 100 cycles are performed.

The method may also include, after forming the trimmed carbon-containing features, (c) depositing a film conformally over the trimmed carbon-containing features by atomic layer deposition without breaking vacuum. The film deposited conformally may include material such as any one or more of silicon oxide, silicon nitride, silicon carbide, and metal oxides. In some embodiments, the trimming and the conformal film deposition are performed in the same chamber.

In some embodiments, the method also includes, after providing the substrate and prior to trimming the carbon-containing features, heating the semiconductor substrate to a temperature between about 35° C. and about 100° C.

In various embodiments, the aspect ratios of the features of the pattern of carbon-containing features on the semiconductor substrate provided to the chamber are between about 6:1 and about 10:1.

In various embodiments, exposing the surface of the carbon-containing features to the oxygen-containing gas further includes introducing a carrier gas such as any one or more of helium, nitrogen, argon, and combinations thereof.

Another aspect involves an apparatus for processing semiconductor substrates, the apparatus including: (a) one or more process chambers, each process chamber including a pedestal; (b) one or more outlets for coupling to a vacuum; (c) one or more gas inlets coupled to one or more oxygen-containing gas sources and associated oxygen-containing gas flow control hardware; (d) one or more gas inlets coupled to one or more inert gas sources and associated inert gas flow control hardware; (e) a plasma generator; and (f) a controller for controlling operations in the apparatus, the controller including at least one processor and a memory, such that the at least one processor and the memory are communicatively connected with one another, the at least one processor is at least operatively connected with the flow-control hardware, and the memory stores computer-executable instructions for: introducing an oxygen-containing gas to a first process chamber; and introducing an inert gas and igniting a plasma such that (i) and (ii) are performed without breaking vacuum.

In some embodiments, the apparatus further includes one or more gas inlets coupled to silicon-containing precursor gas sources and one or more gas inlets coupled to oxygen-containing reactants for reacting with silicon-containing precursor gases; and such that the memory further stores computer-executable instructions for (iii) repeating (i) and (ii) for n cycles, where n is an integer between and including 5 and 100; and (iv) after repeating (iii), introducing alternating pulses of the silicon-containing precursor gas and the oxygen-containing reactant to deposit a silicon oxide film by atomic layer deposition; and such that (i)-(iv) are performed without breaking vacuum.

In some embodiments the apparatus also includes an optical emission spectroscopy sensor.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Patterning methods are used in many semiconductor manufacturing processes. In particular, multiple patterning has been used to extend lithographic technology beyond its optical limits. Double patterning and quad patterning are example technologies used to extend lithographic technology beyond its optical limits and double patterning is now widely used in the industry for pitches less than about 80 nm. Current double patterning techniques include patterning of core materials to form a core pattern. Trim is the process for reducing the critical dimension of core patterns. Trim processes are often used to reduce the critical dimension after lithographically defining a pattern and may be used to extend lithographic technology beyond its optical limits. For example, trim processes reduce the critical dimension of features over a substrate.

Core materials include but are not limited to photoresist, spin on carbon, and amorphous carbon. Trim involves etching the carbon-containing core material, which can be done in different plasma environments. Conventional techniques for photoresist trim involve curing a photoresist to reduce roughness (e.g., line edge roughness) using a non-oxidizing plasma, and using an oxidizing plasma to etch the photoresist o modify the photoresist profile. The oxidizing plasma includes, among other species, ions and radicals, and can be generated by introducing an oxygen-containing gas such as oxygen, nitrous oxide, or carbon dioxide, with a diluting gas, such as argon, helium, or nitrogen. Some conventional techniques also include using a chlorine or bromine-containing plasma to etch the photoresist. However, conventional techniques cause isotropic damage during the plasma etching process due to ion-induced damage. This phenomenon is referred to as "footing." An example is provided in the sequence of substrates depicted in FIGS. 1A-1I.

Figure 1A:
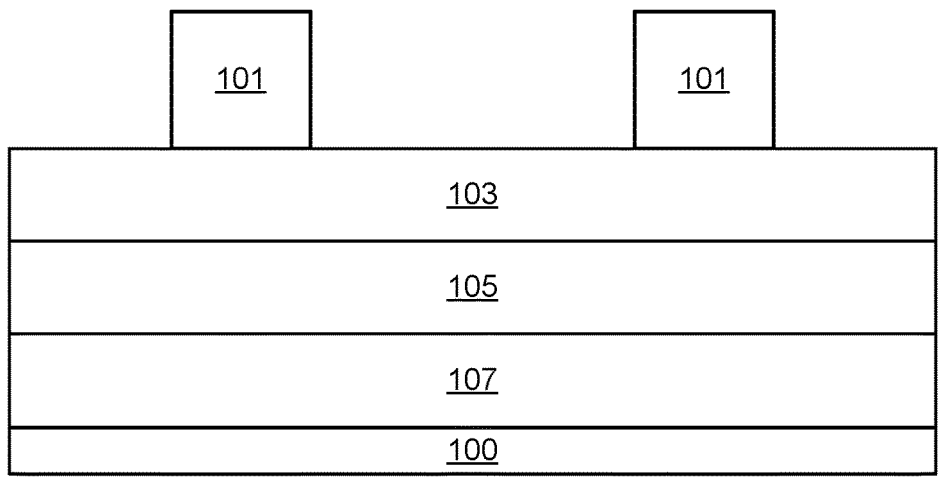
FIGS. 1A-1I are schematic illustrations of substrates in an example of a quad patterning scheme.

FIG. 1A shows a substrate 100 having a lithographically defined or patterned first core 101 on a second core 103, a third core 105, and a target layer 107. One of ordinary skill in the art will appreciate that a multi-layer stack suitable for semiconductor processing as described herein may also include other layers, such as etch stop layers, cap layers, barrier layers, and other underlayers.

The patterned first core 101 may be a carbon-containing or silicon-containing material. In some embodiments, the patterned first core 101 is a photoresist. The patterned first core 101 is lithographically defined and used to etch the second core 103. The second core 103 may be deposited by any suitable deposition technique, such as plasma enhanced chemical vapor deposition (PECVD), and the deposition technique may involve generating a plasma in the deposition chamber from deposition gases including a hydrocarbon precursor. The hydrocarbon precursor may be defined by the formula $C_xH_y$, where x is an integer between 2 and 10, and y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). A dual radio frequency (RF) plasma source including a high frequency (HF) power and a low frequency (LF) power may be used.

Under the second core 103 is the third core 105, which may also be a carbon-containing material deposited by PECVD.

Under the third core 105 is a target layer 107. The target layer 107 may be the layer ultimately to be patterned. The target layer 107 may be a semiconductor, dielectric, or other layer and may be made of silicon (Si), silicon oxide ($SiO_2$), silicon nitride (SiN), or titanium nitride (TiN), for example. The target layer 107 may be deposited by atomic layer deposition (ALD), PEALD, chemical vapor deposition (CVD), or other suitable deposition technique.

Figure 1B:
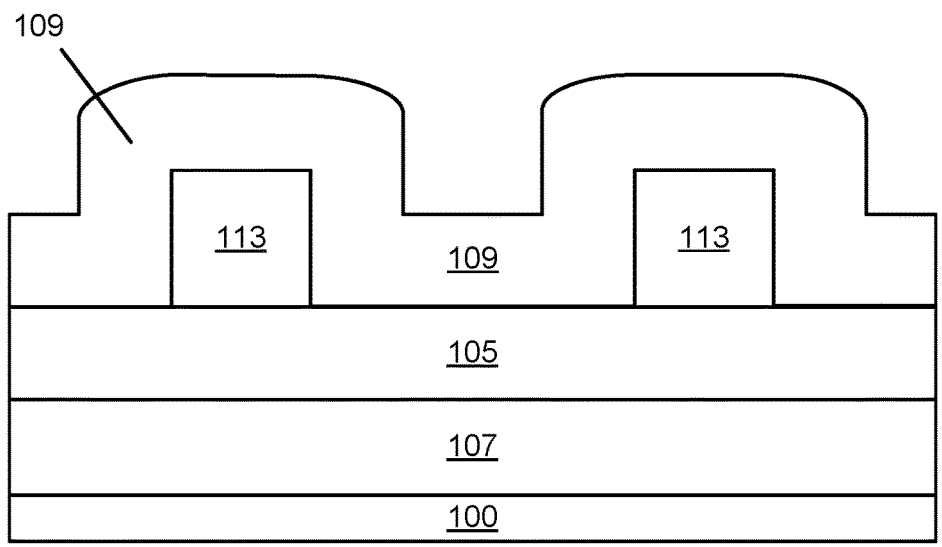

In FIG. 1B, the second core 103 is etched using the patterned first core 101 as a mask to form patterned second core 113, and the patterned first core 101 is removed. A first conformal film 109 is deposited over the patterned second core 113. The first conformal film 109 may be deposited by ALD or PEALD in some embodiments. The first conformal film 109 may be an oxide, such as silicon oxide ($SiO_2$) or titanium oxide ($TiO_2$), or may be a nitride, such as silicon nitride (SiN).

Figure 1C:
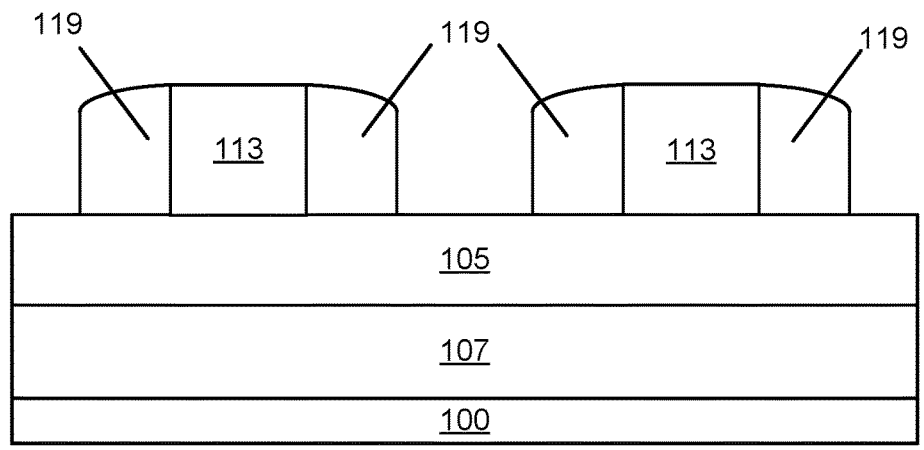

The patterned second core 113 is exposed by etching the first conformal film 109 to form first spacer 119 as shown in FIG. 1C. The pattern of the first spacer 119 is used to pattern subsequent layers. It will be understood that the term "spacer" as used herein means a mask material adjacent to a core material.

Figure 1D:
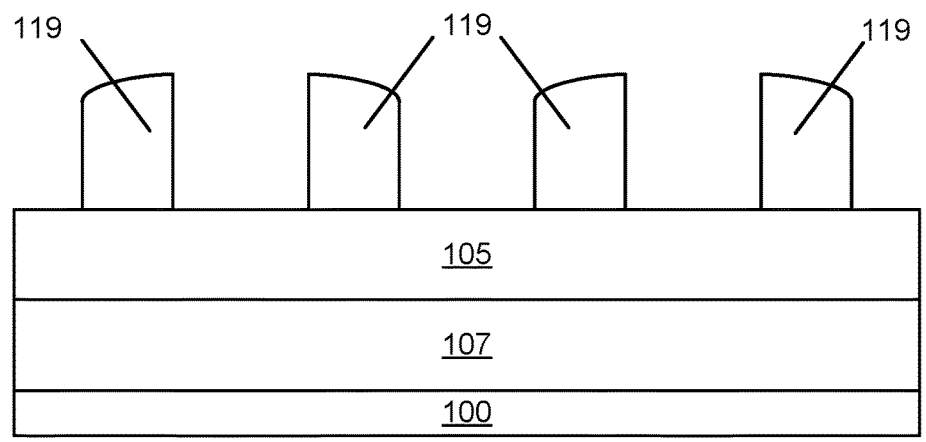

In FIG. 1D, the patterned second core 113 is selectively etched, leaving free-standing first spacers 119 over substrate 100. Selective removal or selecting etching as used herein is defined as etching one material selective to another. For example, in FIG. 1D, the patterned second core 113 is etched selective to the first spacers 119 and selective to third core 105. It will be understood that in some embodiments, if a first material is etched selective to a second material, the etch rate of the first material is faster than the etch rate of the second material such that for a given duration, more of the first material is etched than the second material.

The pattern of the first spacers 119 may have a pitch of about 30 nm to about 50 nm in some embodiments. Since the critical dimension is fairly large, there is little risk of pitch walking at these larger critical dimensions.

Figure 1E:
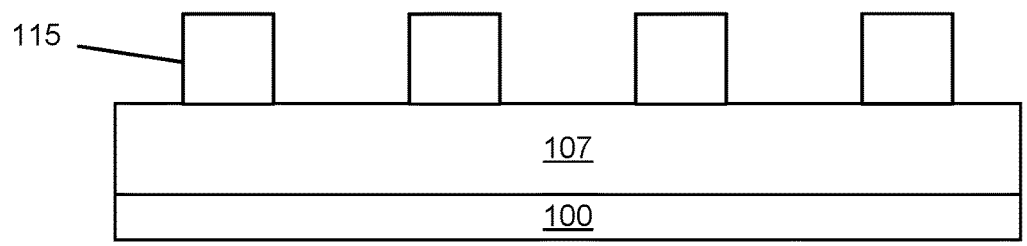

In FIG. 1E, the third core 105 is etched using the first spacers 119 as a mask, thereby transferring the pattern to the third core 105 to form patterned third core 115. The patterned third core 115 may be etched using a chemistry suitable for etching the third core 105 but not the first spacers 119. The patterned third core 115 may be an amorphous carbon layer, amorphous silicon layer, or a photoresist, such as poly(methyl methacrylate) or poly(methyl glutarimide) (PMGI) or phenol formaldehyde resin.

Figure 1F:
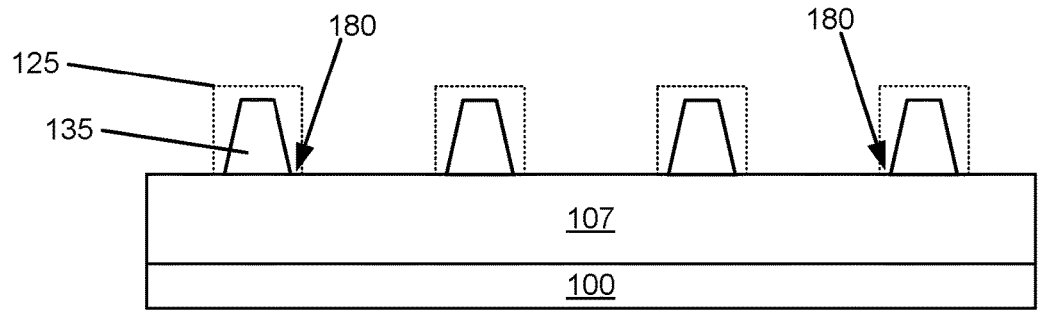

In FIG. 1F, the critical dimension of the patterned third core 115 is reduced by trimming the core material using conventional techniques. The patterned third core 115 is exposed to isotropic plasma etching by igniting an oxygen-containing gas and applying a bias, which results in tapered trimmed third core 135. In some embodiments, a bias is not applied. Outline 125 shows the profile of the patterned third core 115 as compared to the trimmed third core 135. However, since trim of the third core 115 is conventionally performed using an isotropic plasma etching process, it is difficult to etch the corners where the patterned third core 115 and target layer 107 meet as depicted by example arrows 180, which thereby forms a tapered footing effect as shown in FIG. 1F such that the sidewalls of the trimmed third core 135 are sloped. This results in the sidewalls meeting the surface of target layer 107 at an angle greater than 90°. It is desirable in many embodiments for the sidewalls to be substantially vertical such that the angle where the sidewalls of the trimmed third core 135 meet the surface of the target layer 107 is about 90°.

The trim process affects the profile of the trimmed third core 135 which affects subsequent processing profiles, as described further below with respect to FIGS. 1G-1I.

Figure 1G:
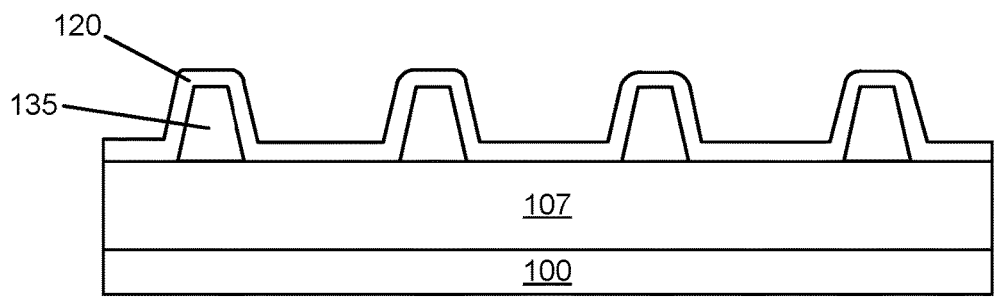

In FIG. 1G, a second conformal film 120 is deposited over the trimmed third core 135. Since the trimmed third core 135 has sloped sidewalls, the second conformal film 120 is also sloped along the sidewalls of the trimmed third core 135. The second conformal film 120 may be a dielectric material deposited by ALD or PEALD. For example, in some embodiments, the second conformal film 120 may be silicon oxide. In some embodiments, the second conformal film 120 may have the same or similar composition to that of first conformal film 109. Note that in conventional techniques, the trimming process as described above with respect to FIG. 1F is performed in an etching tool or chamber separate from that of the deposition of conformal film 120, which can reduce throughput and efficiency.

Figure 1H:
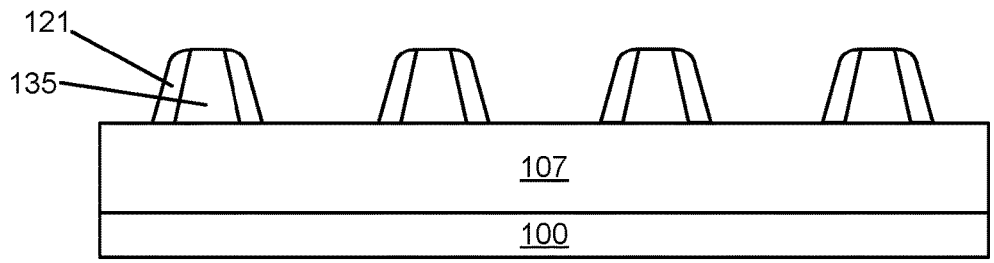

In FIG. 1H, the second conformal film 120 is directionally etched to form second spacers 121 flanking the trimmed third core 135. The sidewalls of second spacers 121 are sloped due to the sloped sidewalls of trimmed third core 135.

Figure 1I:
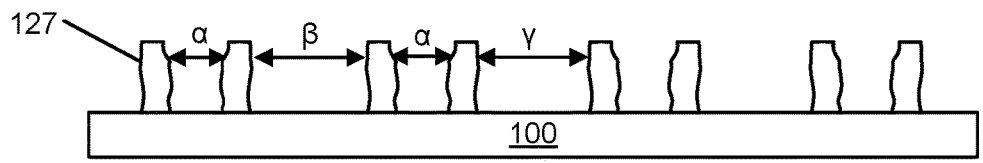

In FIG. 1I, trimmed third core 135 is selectively removed to leave free-standing second spacers that are subsequently used to etch the target layer 107 resulting in patterned target layer 127. In some embodiments, due to the sloped sidewalls of trimmed third core 135, there may be even be some residual third core material 145 left over on the substrate 100. The trimmed third core 135 may be selectively removed using the same or similar chemistry as selectively etching the patterned second core 113 in FIG. 1D. As shown in FIG. 1I, because of the tapered footing from prior core trim processes, the resulting pattern of the target layer 127 is inconsistent such that the sidewalls may not be etched vertically due to footing of the trimmed third core 135. It is desirable to form spacers prior to depositing the second conformal film 120 such that the spacers have vertical sidewalls.

In addition to footing which causes patterning problems, pitch walking is also observed such that the pitch across a substrate varies substantially; for example as shown in FIG. 1I, the pitch may also be inconsistent as shown with respect to the arrows depicted at a, (3, and y. Conventional techniques are insufficient to etch at the corners to reduce footing due to the directionality of the etching species generated from the plasma, which thereby results in core material left unetched in the corners where the core material meets the surface of the target layer.

Provided herein are methods and apparatuses for etching carbon-containing materials by atomic layer etching (ALE) techniques to achieve substantially vertical sidewalls on etched carbon-containing materials for use in patterning applications. Methods involve trimming carbon-containing materials by exposing the carbon-containing material to an oxygen-containing gas without a plasma to modify a surface of the carbon-containing material and exposing the modified surface to an inert gas and igniting a plasma to remove the modified surface in a layer-by-layer etching process. The layer-by-layer characteristic of atomic layer etching allows conformal etching such that footing does not occur and sidewalls of core material meet a planar surface of an underlying layer to be etched at a point that is about 90°±5°. Vertical sidewalls as described herein mean that the sidewalls of core material meet a planar surface of an underlying layer to be etched at a point that is about 90°±5°. Methods are suitable for multiple patterning techniques, such as double patterning and quad patterning. Methods are suitable for reducing the critical dimension of lithographically defined carbon-containing material by any desired amount. For example, in some embodiments, the critical dimension of carbon-containing features may be reduced using certain disclosed embodiments from about 600 Å to about 500 Å. Methods involve etching using ALE.

ALE is a technique that removes thin layers of material using sequential self-limiting reactions. Generally, ALE may be performed using any suitable technique. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etch and etching techniques. Examples of atomic layer etch techniques integrated with atomic layer deposition (ALD) techniques are described in U.S. Pat. No. 9,576,811, issued on Feb. 21, 2017 which is incorporated by reference herein. In various embodiments, ALE may be performed with plasma, or may be performed thermally.

Figure 2:
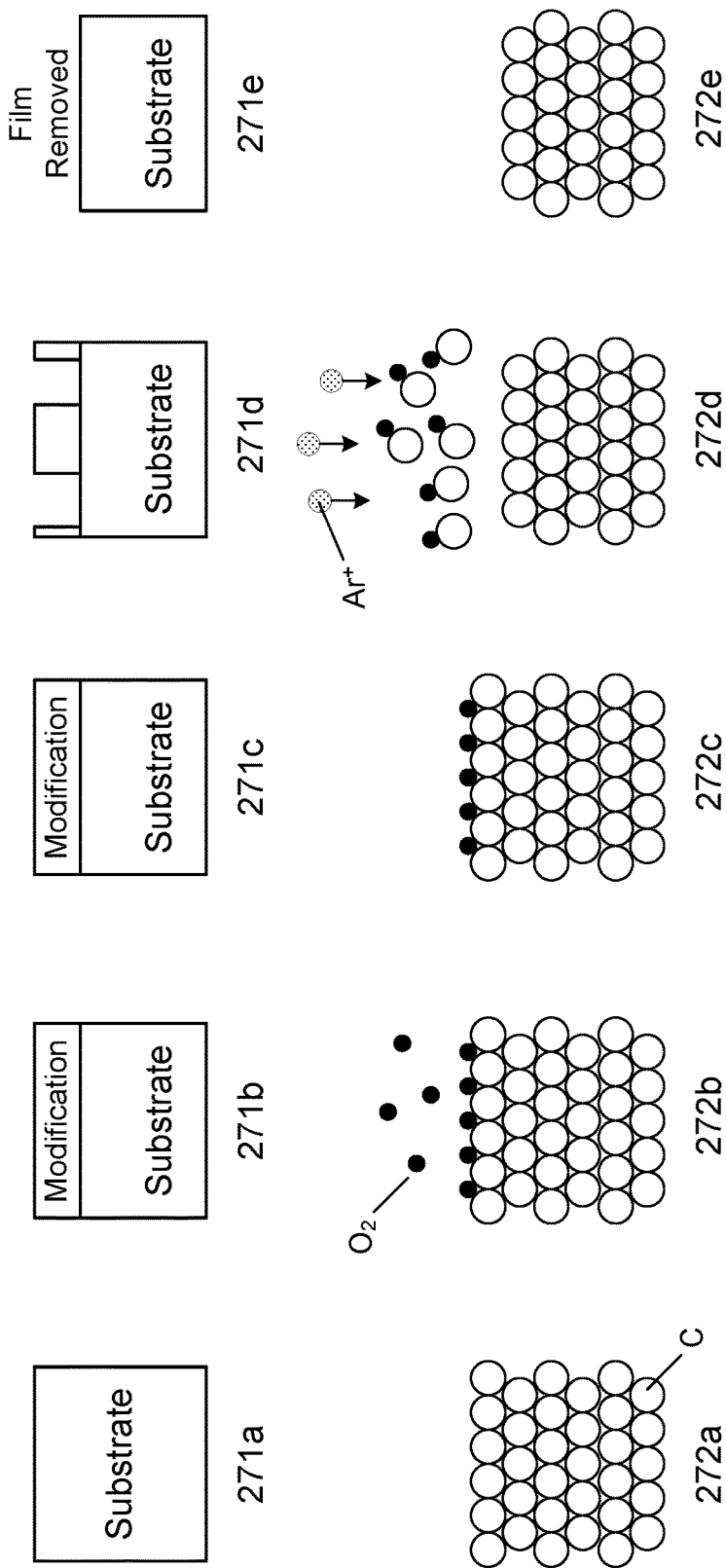
FIG. 2 is a schematic illustration of an example of atomic layer etching.

ALE is performed in cycles. The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas, (ii) purging of the reactant gas from the chamber, (iii) delivery of a removal gas and an optional plasma, and (iv) purging of the chamber. In some embodiments, etching may be performed nonconformally. FIG. 2 shows two example schematic illustrations of an ALE cycle. Diagrams 271a-271e show a generic ALE cycle. In 271a, the substrate is provided. In 271b, the surface of the substrate is modified. In 271c, the next step is prepared. In 271d, the modified layer is being etched. In 271e, the modified layer is removed. Similarly, diagrams 272a-272e show an example of an ALE cycle for etching a carbon-containing film. In 272a, a carbon-containing substrate is provided, which includes many carbon atoms. In 272b, reactant gas oxygen is introduced to the substrate which modifies the surface of the substrate. The schematic in 272b shows that some oxygen is adsorbed onto the surface of the substrate as an example. Although oxygen is depicted in FIG. 2, any oxygen-containing compound or suitable reactant may be used. In 272c, the reactant gas oxygen is purged from the chamber. In 272d, a removal gas argon is introduced with a directional plasma as indicated by the $Ar^+$ plasma species and arrows, and ion bombardment is performed to remove the modified surface of the substrate. Although argon is depicted in FIG. 2, it will be understood that other removal gases may be used, such as helium, nitrogen, argon, and combinations thereof. During removal, a bias is applied to the substrate to attract ions toward it. In 272e, the chamber is purged and the byproducts are removed.

A cycle may only partially etch about 0.1 nm to about 50 nm of material, or between about 0.1 nm and about 5 nm of material, or between about 0.2 nm and about 50 nm of material, or between about 0.2 nm and about 5 nm of material. The amount of material etched in a cycle may depend on the purpose of the etching; for example, the amount of material etched depends on the desired critical dimension of the layer to be etched using the patterned carbon-containing material after etching the carbon-containing material to form the pattern.

Figure 3:
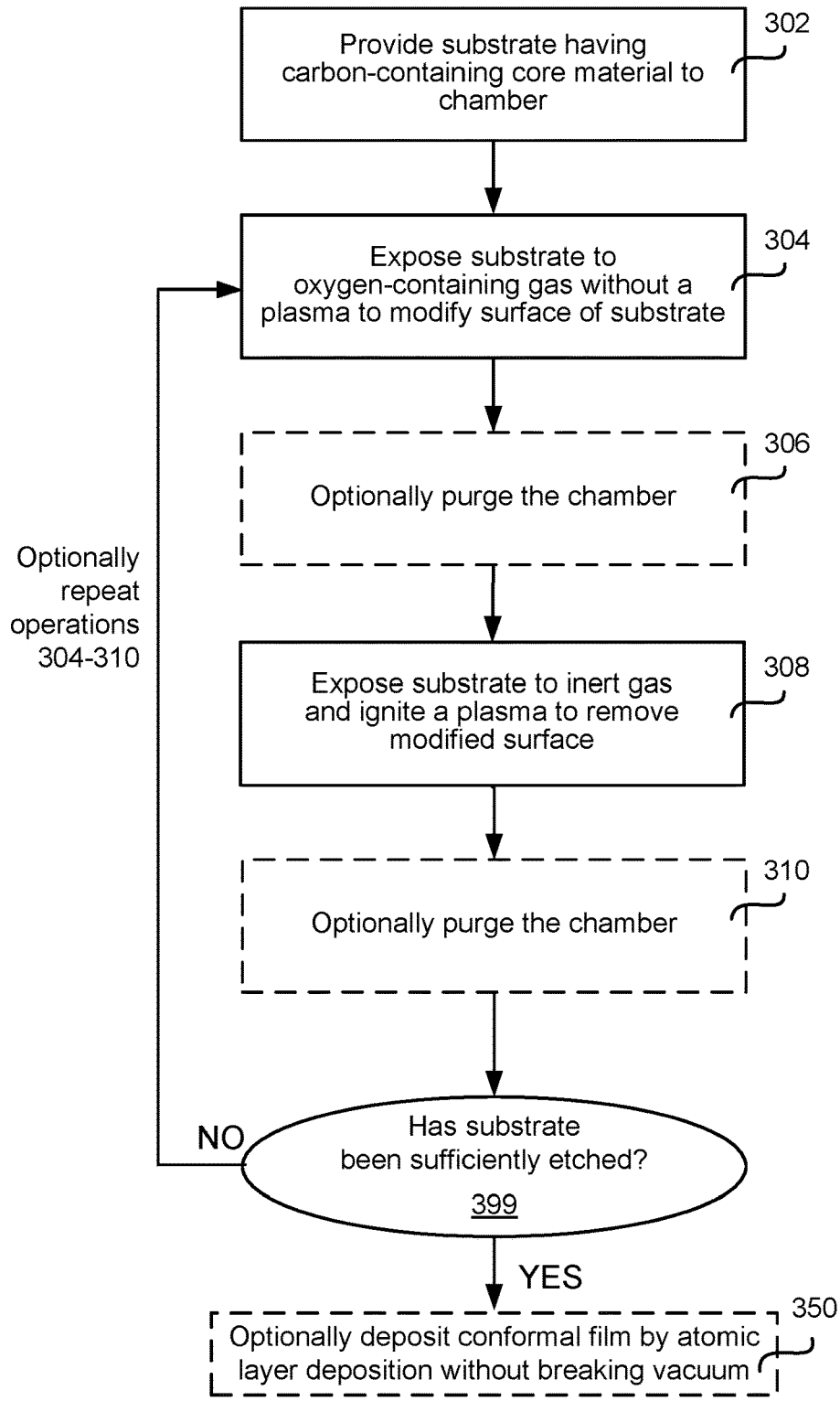
FIG. 3 is a process flow diagram depicting operations for a method performed in accordance with certain disclosed embodiments.

FIG. 3 shows a process flow diagram for performing operations in a method in accordance with certain disclosed embodiments. Operations in FIG. 3 may be performed at a chamber pressure between about 1 mTorr and about 100 Torr, such as between about 4 Torr and about 10 Torr, or between about 1 Torr and about 10 Torr, or between about 1 Torr and about 2 Torr. In operation 301, a substrate or wafer is provided to a processing chamber. The chamber may be a chamber in a multi-chamber apparatus or a single-chamber apparatus. The substrate may be a silicon wafer, e.g., a 200-mm wafer, a 300-mm wafer, or a 450-mm wafer, including wafers having one or more layers of material, such as dielectric, conducting, or semi-conducting material deposited thereon. The substrate may reside on a pedestal for holding the substrate. The pedestal may be set to a temperature between about 35° C. and about 100° C. This temperature may be referred to herein as the substrate temperature though it will be understood that the substrate temperature is the temperature that the pedestal holding the substrate is set to.

In some embodiments, the substrate includes carbon-containing material, such as spin-on carbon, amorphous carbon, or photoresist. The substrate may include a patterned mask layer previously deposited and patterned on the substrate.

In various embodiments, the layers on the substrate are patterned. Substrates include "features", which may be lithographically defined or may be patterned or etched as patterned core material from one or more previous etching processes. Lithographically defined means patterned by photolithography, such as 193 nm lithography, whereby patterns are printed by emitting photons from a photon source onto a mask and printing the pattern onto a photosensitive photoresist, thereby causing a chemical reaction in the photoresist that removes certain portions of the photoresist to form the pattern. In various embodiments, the substrate provided to the chamber includes a lithographically defined pattern of carbon-containing features. Features as used herein refers to the positive features of patterned carbon-containing material. The pitch is the center-to-center distance between features. Features are spaced apart on the substrate surface, whereby the spaces between the features are referred to as "trenches" or "holes." In various embodiments, the substrate underlying the carbon-containing features may include an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the features have aspect ratios of at least about 2:1, at least about 4:1, at least about 6:1, at least about 10:1, at least about 30:1, or higher. In some embodiments, the features have aspect ratios between about 6:1 and about 10:1. Disclosed methods may be performed on substrates with features where the widths of the openings of the trenches or holes between the features are less than about 150 nm.

In operation 304 of FIG. 3, the substrate is exposed to an oxygen-containing gas without igniting a plasma to modify a surface of the carbon-containing material on the substrate. The modification operation forms a thin, reactive surface layer with a thickness that is more easily removed than the un-modified material in the subsequent removal operation. In a modification operation, a carbon-containing material on a substrate may be modified by introducing an oxygen-containing gas into the chamber. Oxygen is used as an example etchant species in disclosed embodiments, but it will be understood that in some embodiments, a different etching gas is introduced into the chamber such as nitrous oxide. In some embodiments, oxygen may be adsorbed onto the surface of the substrate without reacting with the carbon-containing material. In various embodiments, oxygen is introduced into the chamber in a gaseous form and may be optionally accompanied by a carrier gas which may be any of helium, nitrogen, argon, and combinations thereof. In some embodiments, oxygen is introduced with nitrogen to the process chamber. Operation 304 may be performed for a duration sufficient to obtain complete saturation of the substrate surface with the oxygen-containing gas. In some embodiments, the duration may be about 0.1 second. In some embodiments, the duration may be between about 0.1 seconds and about 5 seconds, such as about 0.5 second, or about 1 second.

In operation 306, a purge may be performed. In a purge operation, non-surface-bound active oxygen species may be removed from the process chamber. This can be done by purging and/or evacuating the process chamber to remove the active species, without removing the adsorbed layer. Purging can be done using any inert gas such as $N_2$, Ar, Ne, He and their combinations. In some embodiments, a "burst" purge may be used, whereby the duration of the purge is between about 0.1 seconds and about 0.5 seconds.

In operation 308, the substrate is exposed to an inert gas and a plasma is ignited to remove the modified surface. In a removal operation, the substrate may be exposed to an energy source (e.g. activating or sputtering gas or chemically reactive species that induces removal), such as argon or helium, to etch the substrate by directional sputtering. In some embodiments, the removal operation may be performed by ion bombardment. In some embodiments, it may be suitable to apply a bias to modulate the directionality of the etching to achieve a desired profile. Note, however, that in most embodiments described herein, conformal etching may be achieved without applying a bias.

The amount of sputtering gas may be controlled such as to etch only a targeted amount of material. In various embodiments, the pressure of the chamber may vary between the modification and removal operations. The pressure of the gas may depend on the size of the chamber, the flow rate of the gas, the temperature of the reactor, the type of substrate, and the size of substrate to be etched.

Plasma is ignited at a plasma power selected to reduce sputtering of the material on the substrate surface while controlling the amount of material etched in each cycle. For a four-station chamber (such as to process four substrates simultaneously), the plasma power may be between about 250 W and about 750 W. In some embodiments, the plasma power for a single substrate station may be between about 50 W and about 250 W. Although the use of plasma may cause some sputtering in general, sputtering is generally controlled by performing disclosed embodiments at a high pressure with low plasma power to obtain fine-tuned control over the amount of material etched per cycle and to thereby pattern carbon-containing material to obtain vertical sidewalls. For example, in some embodiments, the chamber pressure may be about 2 Torr with plasma power per substrate station between about 50 W and about 250 W. in some embodiments, the plasma may be ignited for a duration less than about 5 seconds, such as between about 1 second and about 5 seconds.

In operation 310, the chamber may be purged after a removal operation. Purge processes may be any of those used for a purge after a modification operation. In some embodiments, a "burst" purge is performed as described above with respect to operation 306.

In operation 399, it is determined whether the substrate has been sufficiently etched. If not, operations 304-310 may be optionally repeated. Performing operations 304-310 may constitute one ALE cycle. In various embodiments, etching may be performed in cycles. The number of cycles depends on the amount of etching desired for the particular application. In various embodiments, between about 1 cycle and about 100 cycles may be used. In some embodiments, about 5 cycles to about 100 cycles may be used. In some embodiments the number of cycles may be about 1 to about 40 cycles, or about 1 to about 20 cycles, or about 30 to about 40 cycles. Any suitable number of ALE cycles may be included to etch a desired amount of film. In some embodiments, ALE is performed in cycles to etch about 1 Å to about 50 Å of the surface of the layers on the substrate. In some embodiments, cycles of ALE etch between about 2 Å and about 50 Å of the surface of the layers on the substrate. In some embodiments, the number of cycles may be selected by using optical emission spectroscopy (OES) to identify the amount of etch and set an endpoint to stop etching at the endpoint. In some embodiments, the cycle time (duration for a single cycle) may be less than 1 second.

In operation 350, after the substrate is sufficiently etched to form the desired critical dimension of the pattern, a conformal film may be optionally deposited by atomic layer deposition without breaking vacuum. In some embodiments, the conformal film includes silicon oxide. In some embodiments, the conformal film includes silicon nitride, silicon carbide, metal oxides, and combinations thereof. That is, in some embodiments, operations 304-350 may be performed without breaking vacuum. In some embodiments, operations 304-350 are performed in the same chamber. In some embodiments, the chamber includes two or more process stations, and ALE is performed at one process station while ALD is performed at another process station.

It will be understood that in some embodiments, operation 304 is performed prior to operation 308. However, in some embodiments, operation 308 may be performed prior to operation 304. In such embodiments, the plasma may be ignited with introduction of the oxygen-containing gas while the inert gas is introduced without a plasma. For example, in one embodiments, after the substrate is provided, the substrate may be exposed to an inert gas flow without igniting a plasma, the chamber may be optionally purged, the substrate may then be exposed to an oxygen-containing gas and a gas may be ignited without applying a bias, and the chamber may then be optionally purged again. Exposures to the inert gas flow and oxygen-containing plasma may be repeated in cycles as necessary to etch the desired thickness of carbon-containing material.

In another embodiment, after the substrate is provided, the substrate may be exposed to an inert gas flow and a plasma may be ignited, the chamber may be optionally purged, the substrate may then be exposed to an oxygen-containing gas without igniting a plasma, and the chamber may then be optionally purged again. Exposures to the inert gas plasma and oxygen-containing gas may be repeated in cycles as necessary to etch the desired thickness of carbon-containing material. A bias is not applied throughout the operations of ALE.

In another embodiment, after the substrate is provided, the substrate may be exposed to oxygen-containing plasma generated in a remote plasma chamber, the chamber may be optionally purged, the substrate may then be exposed to an inert gas while igniting an in-situ plasma, and the chamber may then be optionally purged again. Exposures to the remotely generated oxygen-containing plasma and in-situ generated inert gas plasma may be repeated in cycles as necessary to etch the desired thickness of carbon-containing material.

Figure 4A:
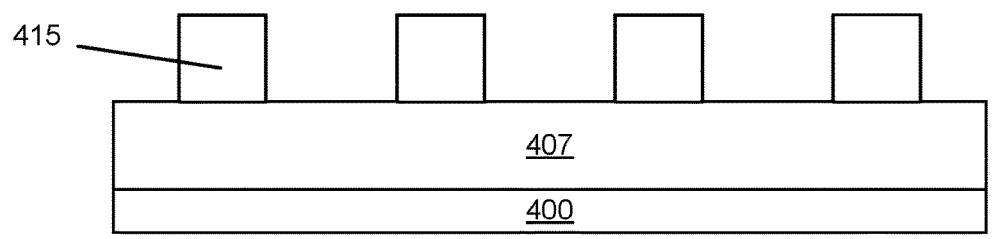
FIGS. 4A-4E are schematic illustrations of substrates in an example of a quad patterning scheme performed in accordance with certain disclosed embodiments.
Figure 4B:
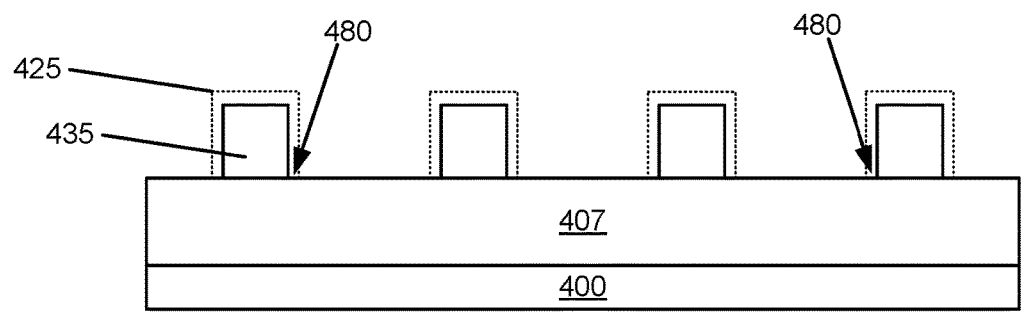
Figure 4C:
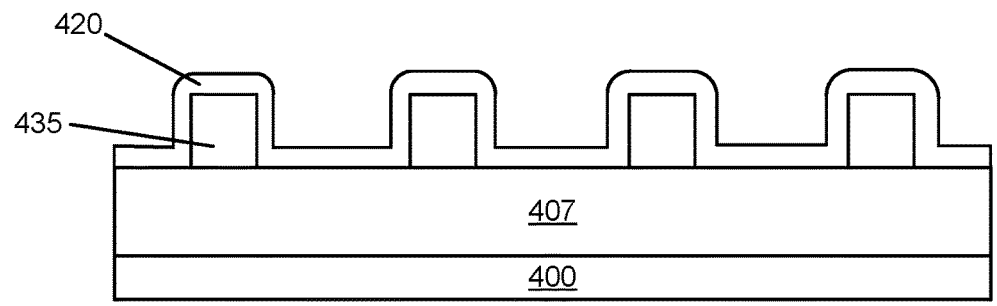

FIGS. 4A-4C show schematic illustrations of substrates undergoing certain disclosed embodiments. FIG. 4A corresponds to FIG. 1E with patterned third core 415 and target layer 407 on substrate 400. In FIG. 4B, the patterned third core 415 is trimmed by atomic layer etching using alternating pulses of oxygen-containing gas without plasma to modify the substrate and inert gas plasma without a bias to remove the modified surface such as described above with respect to FIG. 3, thereby forming trimmed third core 435. Notice that due to the layer by layer etching by atomic layer etching, there is no footing effect (see 480) and the sidewalls of the trimmed third core 435 are vertical and at about a 90° angle from the surface of the target layer 407. Outline 425 shows the outline of the patterned third core 415 prior to atomic layer etching.

In FIG. 4C, a conformal film 420 is deposited over the trimmed third core 435. This may correspond to operation 350 of FIG. 3 whereby a conformal film is deposited by atomic layer deposition following etching by atomic layer etch without breaking vacuum. In some embodiments, etching and depositing are performed in the same chamber. In some embodiments, etching and depositing are performed in a deposition chamber.

Figure 4D:
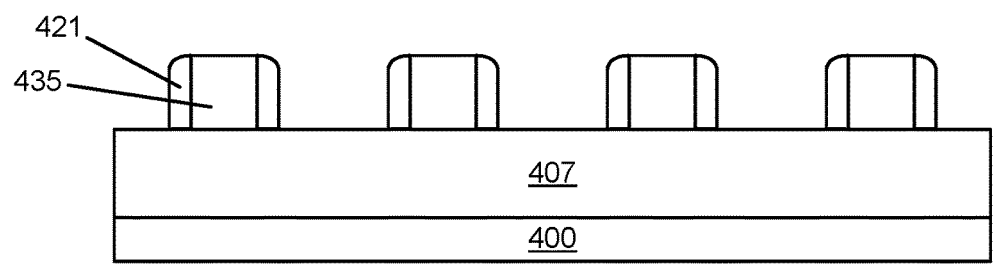
Figure 4E:
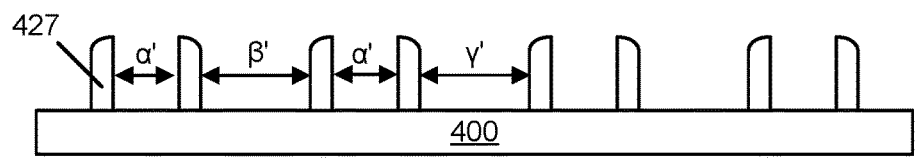

In FIG. 4D, the conformal film 420 is directionally etched to remove the film from the tops of the trimmed third core 435 and bottoms of the trenches to expose the target layer 407 and form spacers 421. In FIG. 4E, the trimmed third core 435 is selectively removed and the spacers 421 are used as a mask to etch the target layer 407 to yield patterned target layer 427, such that the spacing between the pillars of patterned target layer 427 are consistent and symmetrical with vertical sidewalls.

Figure 5:
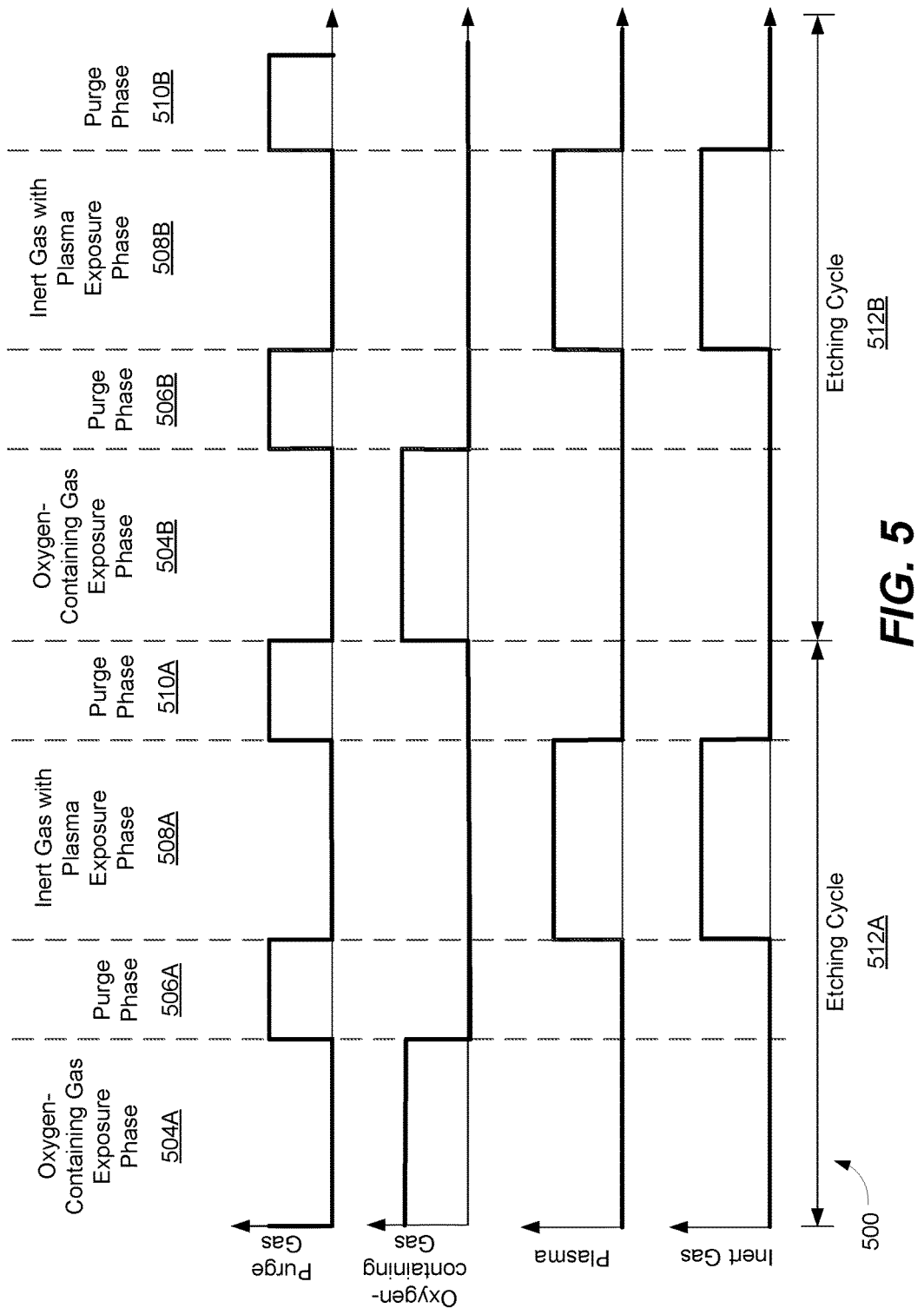
FIG. 5 is a timing schematic diagram depicting an example of operations performed in accordance with certain disclosed embodiments.

FIG. 5 is a timing schematic diagram depicting an example of operations performed in accordance with certain disclosed embodiments. In the example provided in FIG. 5, a process 500 includes two etching cycles 512A and 512B. Etching cycle 512A includes oxygen-containing gas exposure phase 504A, purge phase 506A, inert gas with plasma exposure phase 508A, and purge phase 510A. During oxygen-containing gas exposure phase 504A, which may correspond to operation 304 of FIG. 3, purge gas flow is turned off, plasma is turned off, inert gas flow in this example is turned off, and oxygen-containing gas flow is turned on. Note that while inert gas flow is depicted as being turned off, in some embodiments a carrier gas, which may be an inert gas, may be flowed with the oxygen-containing gas. In some embodiments, the carrier gas is diverted prior to delivery of oxygen-containing gas to the processing chamber. Following oxygen-containing gas exposure phase 504A, purge phase 506A is performed, which may correspond to operation 306 of FIG. 3. During purge phase 506A, a purge gas is flowed, while oxygen-containing gas and inert gas flows are turned off and plasma is turned off. Note that while purge gas and inert gas are listed separately in FIG. 3, in some embodiments, the same gas may be used as a purge gas and as an inert gas used in inert gas with plasma exposure phase 508A. During inert gas with plasma exposure phase 508A, purge gas flow is turned off as well as oxygen-containing gas flow, while an inert gas flow is turned on and plasma is turned on. This phase may correspond to operation 308 of FIG. 3. Although whether a bias is applied is not depicted in FIG. 5, in some embodiments, a bias is not applied during inert gas with plasma exposure phase 508A. Likewise, in some embodiments, a bias is not applied during oxygen-containing gas exposure phase 504A either. In purge phase 510A, which may correspond to operation 310 of FIG. 3, purge gas is flowed while oxygen-containing gas flow and inert gas flows are turned off and plasma is turned off. Etching cycle 512A may be repeated as shown in etching cycle 512B, which includes oxygen-containing gas exposure phase 504B, purge phase 506B, inert gas with plasma exposure phase 508B, and purge phase 510B. During oxygen-containing gas exposure phase 504B, purge gas flow and inert gas flows are turned off, while oxygen-containing gas flow is turned on and plasma is turned off. During purge phase 506B, purge gas flow is turned on while oxygen-containing gas flow and inert gas flows are turned off and plasma is also turned off. During inert gas with plasma exposure phase 508B, purge gas flow and oxygen-containing gas flows are turned off while inert gas flow is turned on and plasma is also turned on. During purge phase 510B, purge gas flow is turned on, while oxygen-containing gas flow and inert gas flows are turned off, and plasma is turned off. Although two etching cycles are depicted in FIG. 5, it will be understood that additional etching cycles may also be performed. Further, although a deposition phase is not depicted, in some embodiments after several etching cycles of atomic layer etching, a conformal film is deposited by atomic layer deposition over the patterned substrate formed from the etching process.

APPARATUS

Figure 6:
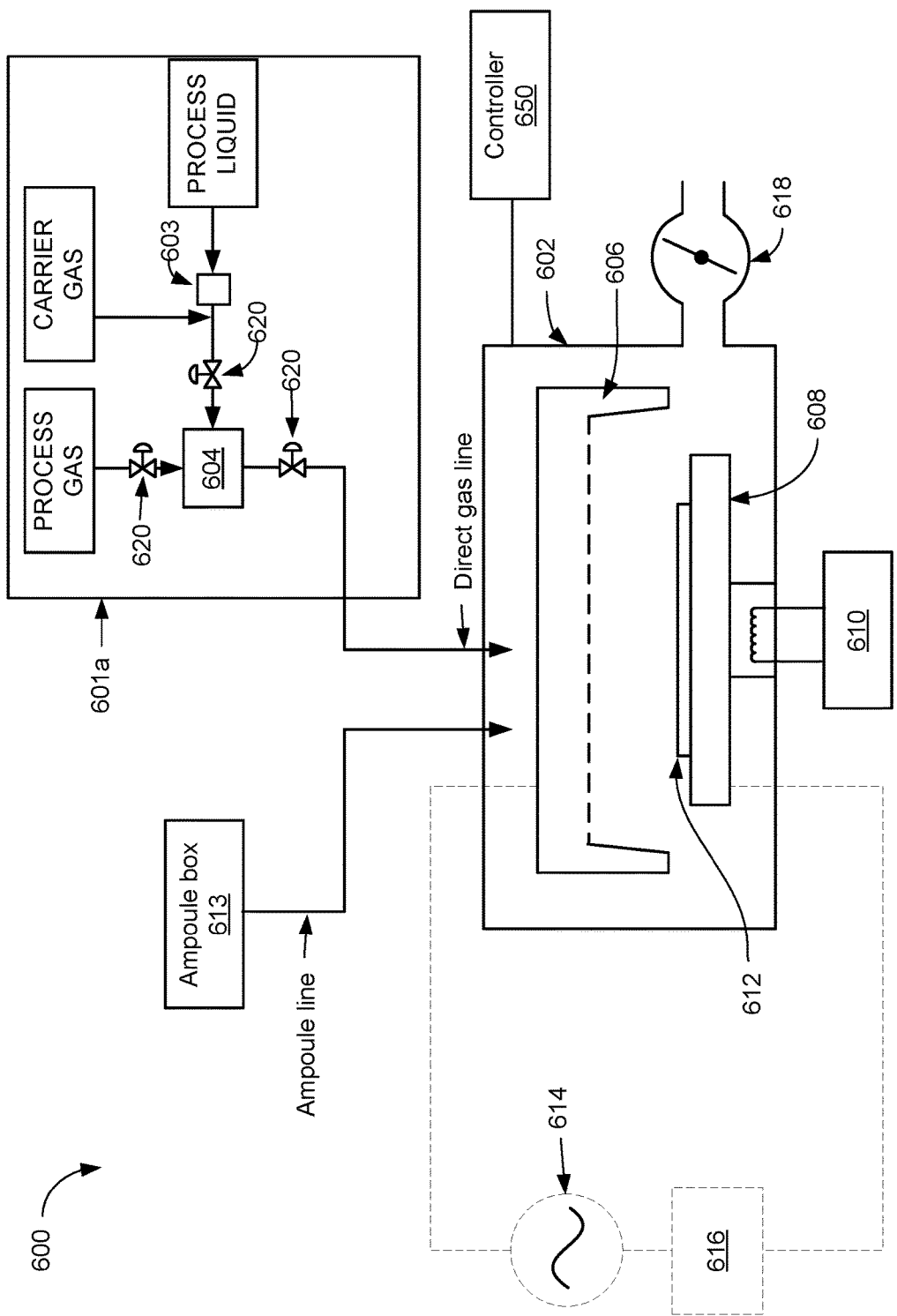
FIG. 6 is a schematic diagram of an example process chamber for performing certain disclosed embodiments.

FIG. 6 depicts a schematic illustration of an embodiment of an atomic layer deposition (ALD) process station 600 having a process chamber 602. The process station 600 may be used for performing certain disclosed embodiments. For example, while process station 600 may typically be used to deposit films on a substrate, process station 600 may be used in certain disclosed embodiments to etch carbon-containing material in a patterning scheme by atomic layer etching (ALE) as described elsewhere herein. In some embodiments, process station 600 may be used for both ALE and ALD, or in some embodiments, several process stations in a multi-station tool may include a station for ALE and a station for ALD such that substrates may be transferred between an ALE station and ALD station without breaking vacuum.

Figure 7:
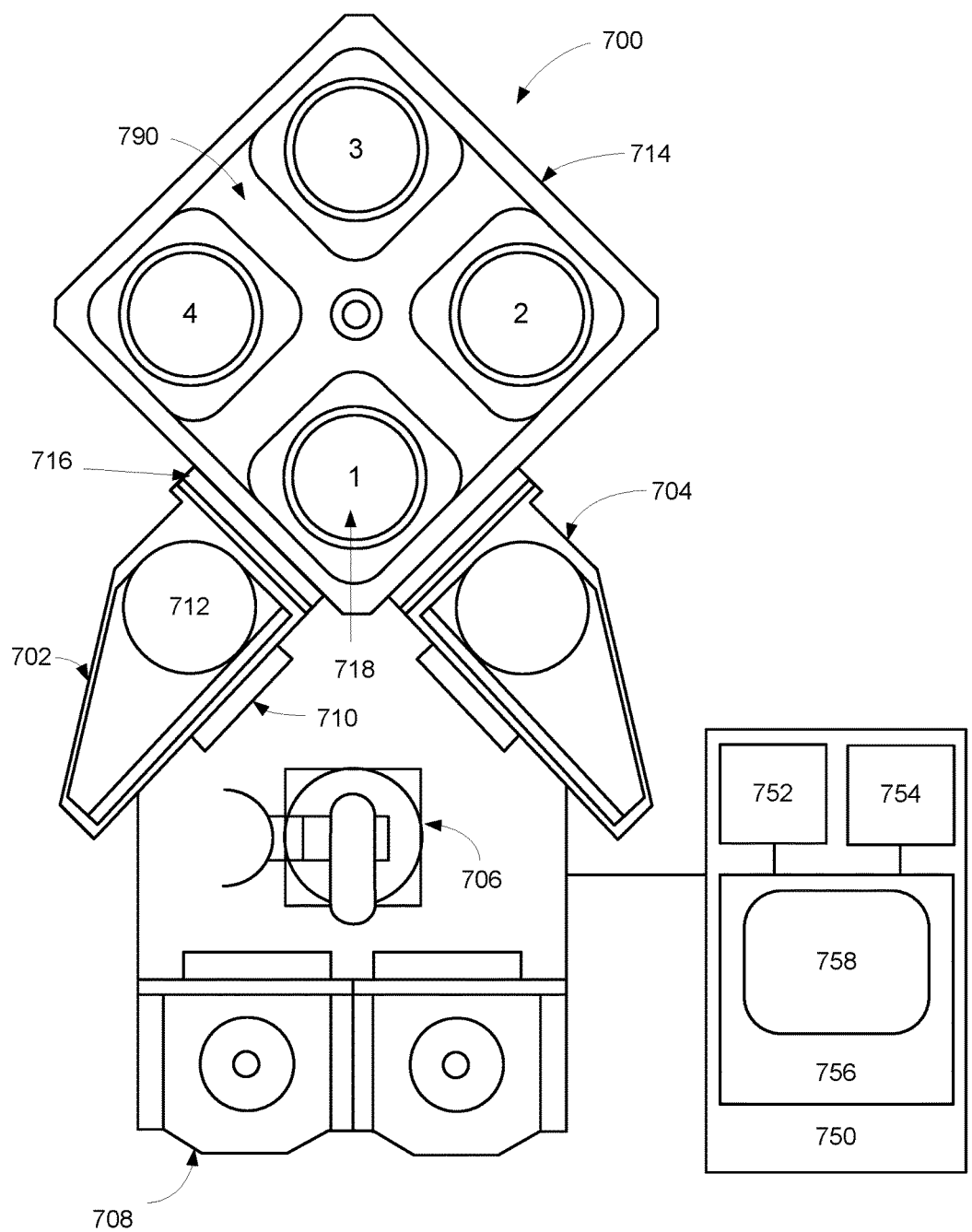
FIG. 7 is a schematic diagram of an example process tool for performing certain disclosed embodiments.

Process chamber 602 may be used for maintaining a low-pressure environment. A plurality of process stations may be included in a common low pressure process tool environment. For example, FIG. 7 depicts an embodiment of a multi-station processing tool 700. In some embodiments, one or more hardware parameters of process station 600, including those discussed in detail below, may be adjusted programmatically by one or more computer controllers 650.

Process station 600 fluidly communicates with reactant delivery system 601a for delivering process gases to a distribution showerhead 606. Reactant delivery system 601a includes a mixing vessel 604 for blending and/or conditioning process gases, such as an oxygen-containing gas, or inert gas, for delivery to showerhead 606. One or more mixing vessel inlet valves 620 may control introduction of process gases to mixing vessel 604.

As an example, the embodiment of FIG. 6 includes a vaporization point 603 for vaporizing liquid reactant to be supplied to the mixing vessel 604. In some embodiments, deposition chemistry may be provided as a vaporized liquid reactant. Deposition chemistry may be used following performing ALE in process chamber 602 to form a patterned carbon-containing material such that a conformal film may be deposited by ALD over the patterned carbon-containing material. In some embodiments, vaporization point 603 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 603 may be heat traced. In some examples, mixing vessel 604 may also be heat traced. In one non-limiting example, piping downstream of vaporization point 603 has an increasing temperature profile extending from approximately 100° C. to approximately 150° C. at mixing vessel 604.

In some embodiments, a liquid precursor or liquid reactant may be vaporized at a liquid injector (not shown). For example, a liquid injector may inject pulses of a liquid reactant into a carrier gas stream upstream of the mixing vessel 604. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 603. In one scenario, a liquid injector may be mounted directly to mixing vessel 604. In another scenario, a liquid injector may be mounted directly to showerhead 606.

In some embodiments, a liquid flow controller (LFC) upstream of vaporization point 603 may be provided for controlling a mass flow of liquid for vaporization and delivery to process chamber 602. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 606 distributes process gases toward substrate 612. In the embodiment shown in FIG. 6, the substrate 612 is located beneath showerhead 606 and is shown resting on a chuck or pedestal 608. In some embodiments, a chamber may include multiple chucks or pedestals. Showerhead 606 may have any suitable shape, and may have any suitable number and arrangement of ports for distributing process gases to substrate 612.

In some embodiments, pedestal 608 may be raised or lowered to expose substrate 612 to a volume between the substrate 612 and the showerhead 606. In some embodiments, pedestal 608 may be temperature controlled via heater 610. Pedestal 608 may be set to any suitable temperature, such as between about 25° C. and about 650° C. or between about 35° C. and about 100° C. during operations for performing various disclosed embodiments. It will be appreciated that, in some embodiments, pedestal height may be adjusted programmatically by a suitable computer controller 650.

In another scenario, adjusting a height of pedestal 608 may allow a plasma density to be varied during plasma activation performed in certain disclosed embodiments. For example, plasma may be ignited when an inert gas is flowed to the substrate 612 via showerhead 606 to remove modified core material after the core material is exposed to an oxygen-containing gas. At the conclusion of a process phase, pedestal 608 may be lowered during another substrate transfer phase to allow removal of substrate 612 from pedestal 608.

In some embodiments, a position of showerhead 606 may be adjusted relative to pedestal 608 to vary a volume between the substrate 612 and the showerhead 606. Further, it will be appreciated that a vertical position of pedestal 608 and/or showerhead 606 may be varied by any suitable mechanism within the scope of the present disclosure. In some embodiments, pedestal 608 may include a rotational axis for rotating an orientation of substrate 612. It will be appreciated that, in some embodiments, one or more of these example adjustments may be performed programmatically by one or more suitable computer controllers 650. The computer controller 650 may include any of the features described below with respect to controller 750 of FIG. 7.

In some embodiments where plasma may be used as discussed above, showerhead 606 and pedestal 608 electrically communicate with a radio frequency (RF) power supply 614 and matching network 616 for powering a plasma. In some embodiments, the plasma energy may be controlled by controlling one or more of a process station pressure, a gas concentration, an RF source power, an RF source frequency, and a plasma power pulse timing. For example, RF power supply 614 and matching network 616 may be operated at any suitable power to form a plasma having a desired composition of radical species. Likewise, RF power supply 614 may provide RF power of any suitable frequency. In some embodiments, RF power supply 614 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. In some embodiments, an OES sensor may be used to set an endpoint to stop etching after a certain amount of time using certain disclosed embodiments. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 650 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., oxygen-containing gas), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second gas such as argon, instructions for modulating the flow rate of a carrier or purge gas, instructions for igniting a plasma at low plasma power between about 250 W and about 750 W for a four-station processing tool, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the third recipe phase. Such recipes may be used to etch carbon-containing material such as core material on a substrate to yield vertical sidewalls that meet the surface of an underlying layer to be etched at a point at about 90°±5°. Additional recipes may also follow and may be used to deposit a conformal film over the patterned core material by ALD. For example, for depositing a silicon oxide conformal film over a patterned core material, one additional recipe phases may include instructions for setting a flow rate of a silicon-containing precursor, and another additional recipe phase may include instructions for setting a flow rate of an oxygen-containing reactant and time delay instructions for the additional recipe phase. It will be appreciated that these recipe phases may be further subdivided and/or iterated in any suitable way within the scope of the present disclosure.

Further, in some embodiments, pressure control for process station 600 may be provided by butterfly valve 618. As shown in the embodiment of FIG. 6, butterfly valve 618 throttles a vacuum provided by a downstream vacuum pump (not shown). However, in some embodiments, pressure control of process station 600 may also be adjusted by varying a flow rate of one or more gases introduced to the process station 600.

As described above, one or more process stations may be included in a multi-station processing tool. FIG. 7 shows a schematic view of an embodiment of a multi-station processing tool 700 with an inbound load lock 702 and an outbound load lock 704, either or both of which may include a remote plasma source (not shown). A robot 706, at atmospheric pressure, is configured to move wafers from a cassette loaded through a pod 708 into inbound load lock 702 via an atmospheric port 710. A wafer (not shown) is placed by the robot 706 on a pedestal 712 in the inbound load lock 702, the atmospheric port 710 is closed, and the load lock inbound 702 is pumped down. Where the inbound load lock 702 includes a remote plasma source, the wafer may be exposed to a remote plasma treatment in the inbound load lock 702 prior to being introduced into a processing chamber 714. Further, the wafer also may be heated in the inbound load lock 702 as well, for example, to remove moisture and adsorbed gases. Next, a chamber transport port 716 to processing chamber 714 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 714 includes four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. For example, in some embodiments, a process station may be switchable between an ALE, an ALD and plasma-enhanced ALD process mode. In some embodiments, exposure to a deposition precursor and exposure to a second reactant and plasma are performed in the same station. Additionally or alternatively, in some embodiments, processing chamber 714 may include one or more matched pairs of ALD and plasma-enhanced ALD process stations. While the depicted processing chamber 714 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog, and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes. System control software 758 may be coded in any suitable computer readable programming language.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700.

A process gas control program may include code for controlling gas composition (e.g., silicon-containing gases, oxygen-containing gases, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 750 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 750 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 750.

In some implementations, the system controller 750 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 750, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 750 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 750, in some implementations, may be a part of or coupled to a computer that is integrated with, coupled to the system, otherwise networked to the system, or a combination thereof. For example, the system controller 750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 750 receives instructions in the form of data, which specify parameters for each of the processing steps to be performed during one or more operations. It should be understood that the parameters may be specific to the type of process to be performed and the type of tool that the system controller 750 is configured to interface with or control. Thus as described above, the system controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 750 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a semiconductor substrate, the method comprising:
    (a) providing to a chamber the semiconductor substrate comprising a carbon-containing material having a pattern of carbon-containing features; and
    (b) trimming the carbon-containing features by atomic layer etching to reduce critical dimension and form trimmed carbon-containing features having vertical sidewalls, the atomic layer etching comprising:
        (i) exposing a surface of the carbon-containing features to an oxygen-containing gas without a plasma to modify the surface of the carbon-containing features forming a modified surface of the carbon-containing features; and
        (ii) exposing the modified surface of the carbon-containing features to an inert gas and igniting a plasma to remove the modified surface of the carbon-containing features.

2. The method of claim 1, wherein the oxygen-containing gas is selected from the group consisting of oxygen and nitrous oxide.

3. The method of claim 1, wherein the inert gas is selected from the group consisting of helium, nitrogen, argon, and combinations thereof.

4. The method of claim 1, wherein the carbon-containing features comprise a material selected from the group consisting of spin-on carbon, photoresist, and amorphous carbon.

5. The method of claim 1, wherein the chamber is set to a chamber pressure between about 1 Torr and about 10 Torr.

6. The method of claim 1, wherein the plasma is ignited using a plasma power between about 50 W and 250 W.

7. The method of claim 1, further comprising purging the chamber between exposing the surface of the carbon-containing features to the oxygen-containing gas without a plasma and exposing the surface of the carbon-containing features to the inert gas and igniting the plasma.

8. The method of claim 7, wherein the chamber is purged for a duration between about 0.1 seconds and about 0.5 seconds.

9. The method of claim 1, wherein the atomic layer etching further comprises repeating (i) and (ii) in cycles.

10. The method of claim 9, wherein between about 5 cycles and about 100 cycles are performed.

11. The method of claim 9, further comprising after forming the trimmed carbon-containing features,
    (c) depositing a film conformally over the trimmed carbon-containing features by atomic layer deposition without breaking vacuum.

12. The method of claim 11, wherein (b) and (c) are performed in the same chamber.

13. The method of claim 11, wherein the film deposited conformally comprises material selected from the group consisting of silicon oxide, silicon nitride, silicon carbide, and metal oxides.

14. The method of claim 1, further comprising after providing the semiconductor substrate and prior to trimming the carbon-containing features, heating the substrate to a temperature between about 35° C. and about 100° C.

15. The method of claim 1, wherein aspect ratios of the carbon-containing features of the pattern of carbon-containing features on the semiconductor substrate provided to the chamber are between about 6:1 and about 10:1.

16. The method of claim 1, wherein exposing the surface of the carbon-containing features to the oxygen-containing gas further comprises introducing a carrier gas selected from the group consisting of helium, nitrogen, argon, and combinations thereof.

* * * * *